US012525474B2

(12) United States Patent
Lee et al.

(10) Patent No.: US 12,525,474 B2
(45) Date of Patent: Jan. 13, 2026

(54) APPARATUS FOR TREATING SUBSTRATE AND METHOD FOR TREATING SUBSTRATE

(71) Applicant: SEMES CO., LTD., Cheonan-si (KR)

(72) Inventors: Jee Young Lee, Suwon-si (KR); Young Dae Chung, Incheon (KR); Ji Hoon Jeong, Hwaseong-si (KR); Won-Geun Kim, Goyang-si (KR); Tae Shin Kim, Suwon-si (KR)

(73) Assignee: Semes Co., LTD., Chungcheongnam-do (KR)

( * ) Notice: Subject to any disclaimer, the term of this patent is extended or adjusted under 35 U.S.C. 154(b) by 731 days.

(21) Appl. No.: 17/865,918

(22) Filed: Jul. 15, 2022

(65) Prior Publication Data

US 2023/0039663 A1 Feb. 9, 2023

(30) Foreign Application Priority Data

Jul. 22, 2021 (KR) ........................ 10-2021-0096137

(51) Int. Cl.
*H01L 21/67* (2006.01)
*H01L 21/306* (2006.01)
*H01L 21/66* (2006.01)

(52) U.S. Cl.
CPC .. *H01L 21/67253* (2013.01); *H01L 21/30604* (2013.01); *H01L 21/67075* (2013.01); *H01L 22/26* (2013.01)

(58) Field of Classification Search
CPC ......... H01L 21/67253; H01L 21/67248; H01L 21/6715; H01L 21/02675; H01L 21/67098
See application file for complete search history.

(56) References Cited

U.S. PATENT DOCUMENTS

2005/0018196 A1* 1/2005 Kusuda ............. H01L 21/67115 356/448
2010/0090125 A1* 4/2010 Yamazaki ........... H01L 21/0242 250/492.2

(Continued)

FOREIGN PATENT DOCUMENTS

JP 2009-021339 A 1/2009
JP 2011049449 A 3/2011

(Continued)

OTHER PUBLICATIONS

JP 2011187761 A Translation (Year: 2011).*

(Continued)

*Primary Examiner* — Yara B Green
*Assistant Examiner* — Coralie A Nettles
(74) *Attorney, Agent, or Firm* — Harness, Dickey & Pierce, P.L.C.

(57) ABSTRACT

The inventive concept provides a substrate treating apparatus. The substrate treating apparatus includes a support unit horizontally maintaining a substrate; a laser irradiation unit for irradiating the substrate with a laser; a photo-detector for detecting an energy of a reflective light reflected from the substrate among a laser irradiated on the substrate; and a processor, and wherein the processor irradiates a first laser of a first output to the substrate, and sets a second output of a second laser for irradiating the substrate to heat the substrate, based on an energy of a first reflective light reflected from the substrate by the first laser detected from the photo-detector.

8 Claims, 9 Drawing Sheets

(56) References Cited

U.S. PATENT DOCUMENTS

| | | | |
|---|---|---|---|
| 2013/0010289 A1 | 1/2013 | Nakamizo et al. | |
| 2015/0079701 A1 | 3/2015 | Yamashita | |
| 2019/0362992 A1* | 11/2019 | Monodane | B23K 26/0823 |
| 2020/0146111 A1 | 5/2020 | Sekimoto | |
| 2021/0060625 A1* | 3/2021 | Shin | B08B 7/0042 |

FOREIGN PATENT DOCUMENTS

| | | | | |
|---|---|---|---|---|
| JP | 2011187761 | A | * | 9/2011 |
| JP | 2013016697 | A | | 1/2013 |
| JP | 2015060852 | A | | 3/2015 |
| JP | 2020077752 | A | | 5/2020 |
| KR | 10-2009-0008454 | A | | 1/2009 |
| KR | 10-2172593 | | | 11/2020 |
| KR | 10-2020-0144473 | A | | 12/2020 |
| KR | 102248770 | | | 5/2021 |

OTHER PUBLICATIONS

Japanese Office Action, dated Aug. 8, 2023, issued in corresponding Japanese Patent Application No. 2022-110408.

Office Action dated Jan. 30, 2024 issued in corresponding Japanese Patent Application No. 2022-110408.

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2021-0096137 filed on Jul. 22, 2021, in the Korean Intellectual Property Office, the entire contents of which are hereby incorporated by reference.

BACKGROUND

Embodiments of the inventive concept described herein relate to a substrate treating apparatus and a substrate treating method.

Various processes, such as photolithography, etching, ashing, ion implantation, thin-film deposition, cleaning, and the like, are performed on a substrate to manufacture semiconductor elements or a liquid crystal display. Among the various processes, the etching or cleaning process is a process of removing unnecessary areas from a thin film formed on the substrate. There is a need for high selectivity, high etch rate, and etch uniformity for the thin film, and with high integration of semiconductor elements, higher levels of etch selectivity and etch uniformity are required.

In general, in an etching or cleaning process, a chemical treatment step, a rinsing step, and a drying step are sequentially performed on a substrate. In the chemical treatment step, a chemical is dispensed onto the substrate to etch a thin film formed on the substrate or to remove foreign matter on the substrate, and in the rinsing step, a rinsing solution such as DI water is dispensed onto the substrate. The treatments of the substrate using the fluids may be accompanied by heating of the substrate. The present applicant introduces a laser as a heating source of the substrate. A method in which a laser is introduced for heating the substrate is described in Korean Application No. 10-2020-0117842 filed by the applicant.

FIG. 1 is a graph illustrating a temperature change over a time when a first wafer and a second wafer are treated with a same laser output in a same recipe. As referred to FIG. 1, when the same output and the same recipe are applied, a time and an arrival temperature for reaching a set temperature may vary according to the type of wafer. In addition, the time and the arrival temperature for reaching the set temperature varies depending on a state (e.g., film) of a surface to which the laser is irradiated or a thickness of a wafer.

SUMMARY

Embodiments of the inventive concept provide a substrate treating apparatus capable of efficiently treating a substrate.

Embodiments of the inventive concept provide a substrate treating apparatus capable of improving an etching performance.

Embodiments of the inventive concept provide a substrate treating apparatus capable of heating in a same manner different substrates when they are brought into the apparatus.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a support unit horizontally maintaining a substrate; a laser irradiation unit for irradiating the substrate with a laser; a photo-detector for detecting an energy of a reflective light reflected from the substrate among a laser irradiated on the substrate; and a processor, and wherein the processor irradiates a first laser of a first output to the substrate, and sets a second output of a second laser for irradiating the substrate to heat the substrate, based on an energy of a first reflective light reflected from the substrate by the first laser detected from the photo-detector.

In an embodiment, the laser irradiation unit irradiates the laser to a bottom surface of the substrate.

In an embodiment, the first output is lower than the second output.

In an embodiment, the substrate treating apparatus further includes a liquid supply unit for supplying a liquid on the substrate, and wherein the processor forms a liquid film on the substrate, and irradiates the second laser of the second output to the substrate.

In an embodiment, the processor compares the energy of the first reflective light with a reference value which is pre-stored, and sets the second output to be higher than a reference output of the reference value if the energy of the first reflected light is larger than an energy of a reflected light of the reference value, and sets the second output to be lower than the reference output of the reference value if the energy of the first reflected light is smaller than the energy of the reflected light of the reference value.

In an embodiment, the processor calculates a reflectivity and an absorption rate from the energy of the first reflective light, and the second output is set to be inversely proportioned to the absorption rate.

In an embodiment, an energy absorbed by the substrate by the second output is set to be the same as an energy absorbed by a reference wafer according to a reference output of a pre-stored reference value.

In an embodiment, the photo-detector detects a reflective light in real time while the substrate is heat treated with the second laser, and the processor monitors the reflective light being detected in real time, and adjusts an intensity of the second output if an energy of the reflective light changes.

In an embodiment, the intensity of the second output is adjusted to be weaker if the energy of the reflective light becomes smaller.

In an embodiment, the intensity of the second output is adjusted to be stronger if the energy of the reflective light becomes larger.

The inventive concept provides a substrate treating method for heating a substrate by irradiating a laser on the substrate. The substrate treating method includes irradiating a first laser of a first output to the substrate with a laser irradiation unit with respect to a loaded substrate; detecting an energy of a first reflective light reflected from the substrate among a first laser with a photo-detector; and setting a second output of a second laser to heat the substrate based on the energy of the first reflective light detected by the photo-detector.

In an embodiment, the laser is irradiated to a bottom surface of the substrate.

In an embodiment, the first output is lower than the second output.

In an embodiment, the processor compares the energy of the first reflective light with a reference value which is pre-stored, and sets the second output to be higher than an output corresponding to the reference value if the energy of the first reflected light is larger than the reference value, and sets the second output to be lower than the output corresponding to the reference value if the energy of the first reflected light is smaller than the reference value.

In an embodiment, a reflectivity and an absorption rate from the energy of the first reflective light is calculated, and the second output is set to be inversely proportioned to the absorption rate.

In an embodiment, an energy absorbed by the substrate by the second output is set to be the same as an energy absorbed by a reference wafer according to a reference output of a pre-stored reference value.

In an embodiment, the photo-detector detects a reflective light in real time while the substrate is heat treated with the second laser, and the processor monitors the reflective light being detected in real time, and adjusts an intensity of the second output if an energy of the reflective light changes.

In an embodiment, the intensity of the second output is adjusted to be weaker if the energy of the reflective light becomes smaller.

In an embodiment, the intensity of the second output is adjusted to be stronger if the energy of the reflective light becomes larger.

The inventive concept provides a substrate treating apparatus. The substrate treating apparatus includes a support unit horizontally maintaining a substrate; a liquid supply unit for supplying a liquid to the substrate; a laser irradiation unit for irradiating a bottom surface of the substrate with a laser; a photo-detector for detecting an energy of a reflective light reflected from the substrate among a laser irradiated on the substrate; and a processor, and wherein the processor irradiates a first laser of a first output to the substrate, sets a second output of a second laser for irradiating the substrate to heat the substrate, based on an energy of a first reflective light reflected from the substrate by the first laser detected from the photo-detector, forms a liquid film on the substrate, and irradiates the second laser of the second output with respect to the substrate.

According to an embodiment of the inventive concept, a substrate may be efficiently treated.

According to an embodiment of the inventive concept, an etching performance may be improved.

According to an embodiment of the inventive concept, different substrates may be heated in the same manner when they are brought into the apparatus.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
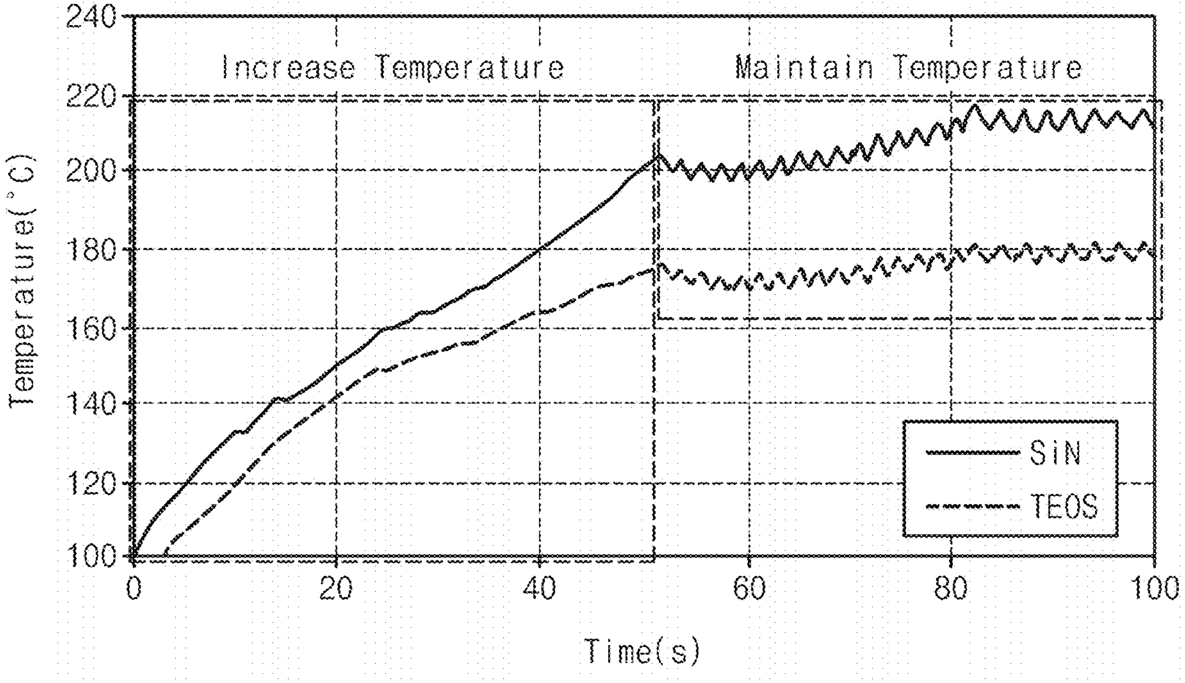
FIG. 1 is a graph illustrating a temperature change over a time when a first wafer and a second wafer are treated with a same laser output in a same recipe.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

In this embodiment, a process of etching a substrate using a treating liquid will be described as an example. However, without being limited thereto, this embodiment is applicable to various substrate treating processes using liquids, such as a cleaning process, an ashing process, a developing process, and the like.

Here, the substrate may have a comprehensive concept that includes all substrates used to manufacture semiconductor elements, flat panel displays (FPDs), and other objects having circuit patterns formed on thin films. Examples of the substrate include a silicon wafer, a glass substrate, an organic substrate, and the like, Hereinafter, embodiments of the inventive concept will be described in detail with reference to FIG. 2 to FIG. 20.

Figure 2:
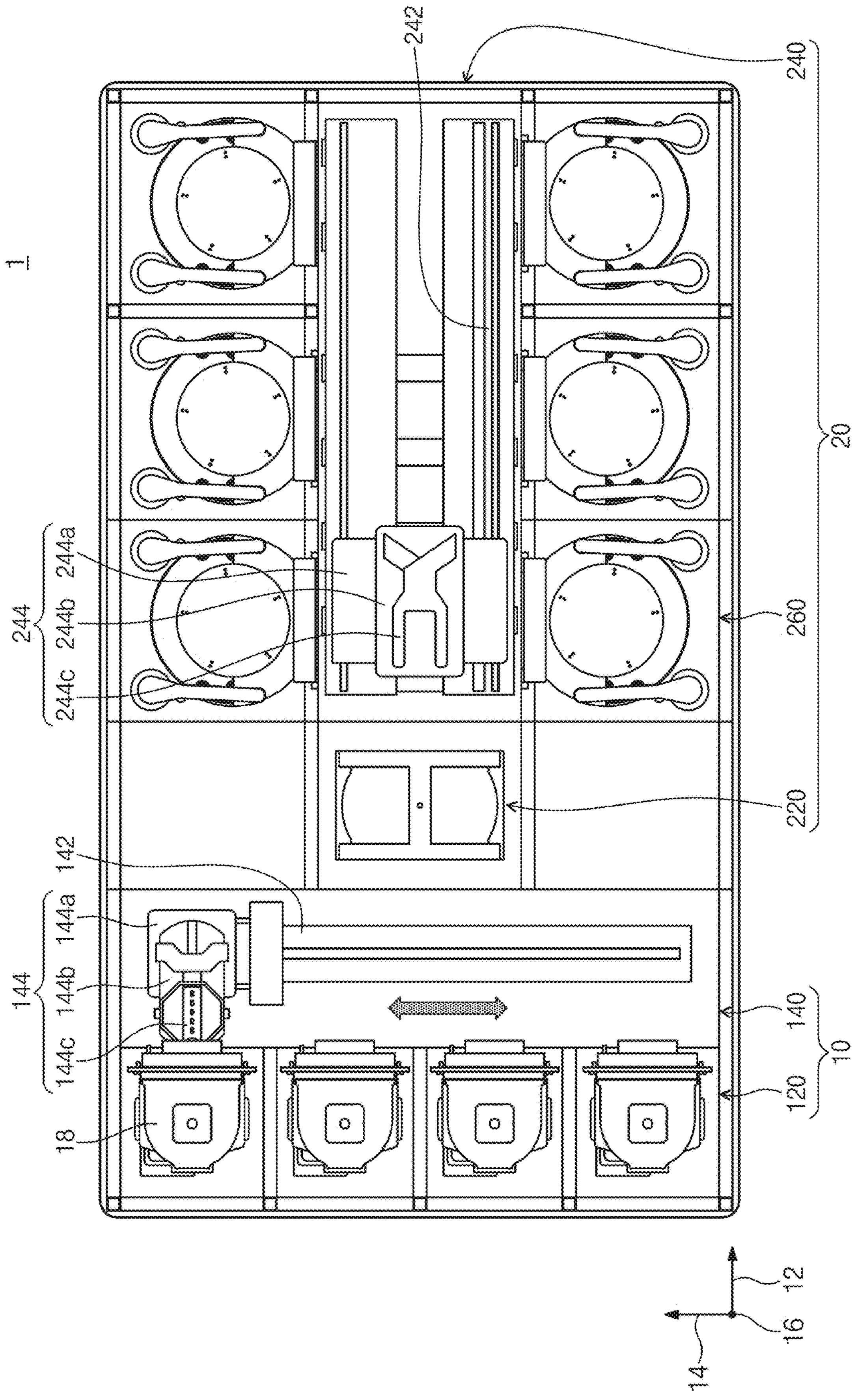
FIG. 2 is a plan view illustrating a substrate treating facility 1 according to an embodiment of the inventive concept.

FIG. 2 is a plan view illustrating substrate treating equipment 1 according to an embodiment of the inventive concept. Referring to FIG. 2, the substrate treating equipment 1 includes an index module 10 and a process module 20. The index module 10 includes a load port 120 and a transfer frame 140. The load port 120, the transfer frame 140, and the process module 20 are sequentially arranged in a row.

Hereinafter, a direction in which the load port 120, the transfer frame 140, and the process module 20 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

A carrier 18 having substrates W received therein is seated on the load port 120. A plurality of load ports 120 may be provided. The load ports 120 may be disposed in a row along the second direction 14. The number of load ports 120 may be increased or decreased depending on process efficiency and footprint of the process module 20. The carrier 18 has a plurality of slots (not shown) formed therein in which the substrates W are received in a state of being horizontally disposed with respect to the ground. A front opening unified pod (FOUP) may be used as the carrier 18.

The process module 20 includes a buffer unit 220, a transfer chamber 240, and a process chamber 260.

The transfer chamber 240 is disposed such that the lengthwise direction thereof is parallel to the first direction 12. A plurality of process chambers 260 may be disposed on one side or opposite sides of the transfer chamber 240. On the opposite sides of the transfer chamber 240, the plurality of process chambers 260 may be disposed to be symmetric with respect to the transfer chamber 240. Some of the process chambers 260 are disposed along the lengthwise direction of the transfer chamber 240. Furthermore, other process chambers 260 are stacked one above another. That is, the process chambers 260 may be disposed in an A×B arrangement on the one side of the transfer chamber 240. Here, "A" denotes the number of process chambers 260 provided in a row along the first direction 12, and "B" denotes the number of process chambers 260 provided in a column along the third direction 16. When four or six process chambers 260 are provided on the one side of the transfer chamber 240, the process chambers 260 may be disposed in a 2×2 or 3×2 arrangement. The number of process chambers 260 may be increased or decreased. Alternatively, the process chambers 260 may be provided on only the one side of the transfer chamber 240. In another case, the process chambers 260 may be disposed in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not shown) formed therein in which the substrates W are received. The slots (not shown) are spaced apart from each other along the third direction 16. The buffer unit 220 is open at one side facing the transfer frame 140 and at an opposite side facing the transfer chamber 240.

The transfer frame 140 transfers the substrates W between the carriers 18 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144*a*, a body 144*b*, and an index arm 144*c*. The base 144*a* is movable along the index rail 142. The body 144*b* is coupled to the base 144*a*. The body 144*b* is movable on the base 144*a* along the third direction 16. Furthermore, the body 144*b* is rotatable on the base 144*a*. The index arm 144*c* is coupled to the body 144*b* and is movable forward and backward relative to the body 144*b*. A plurality of index arms 144*c* may be provided. The index arms 144*c* may be individually driven. The index arms 144*c* may be stacked one above another with a spacing gap therebetween along the third direction 16. Some of the index arms 144*c* may be used to transfer the substrates W from the process module 20 to the carriers 18, and the other index arms 144*c* may be used to transfer the substrates W from the carriers 18 to the process module 20. Accordingly, particles generated from the substrates W that are to be treated may be prevented from adhering to the treated substrates W in the process in which the index robot 144 transfers the substrates W between the carriers 18 and the process module 20.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244*a*, a body 244*b*, and a main arm 244*c*. The base 244*a* is movable along the guide rail 242. The body 244*b* is coupled to the base 244*a*. The body 244*b* is movable on the base 244*a* along the third direction 16. Furthermore, the body 244*b* is rotatable on the base 244*a*. The main arm 244*c* is coupled to the body 244*b* and is movable forward and backward relative to the body 244*b*. A plurality of main arms 244*c* may be provided. The main arms 244*c* may be individually driven. The main arms 244*c* may be stacked one above another with a spacing gap therebetween along the third direction 16.

The process chambers 260 are equipped with substrate treating apparatuses 300 for performing liquid treatment processes on the substrates W. The substrate treating apparatuses 300 may have different structures depending on the types of liquid treatment processes performed by the substrate treating apparatuses 300. Alternatively, the substrate treating apparatuses 300 in the respective process chambers 260 may have the same structure. Selectively, the process chambers 260 may be divided into a plurality of groups. The substrate treating apparatuses 300 in the process chambers 260 belonging to the same group may have the same structure, and the substrate treating apparatuses 300 in the process chambers 260 belonging to different groups may have different structures.

Figure 3:
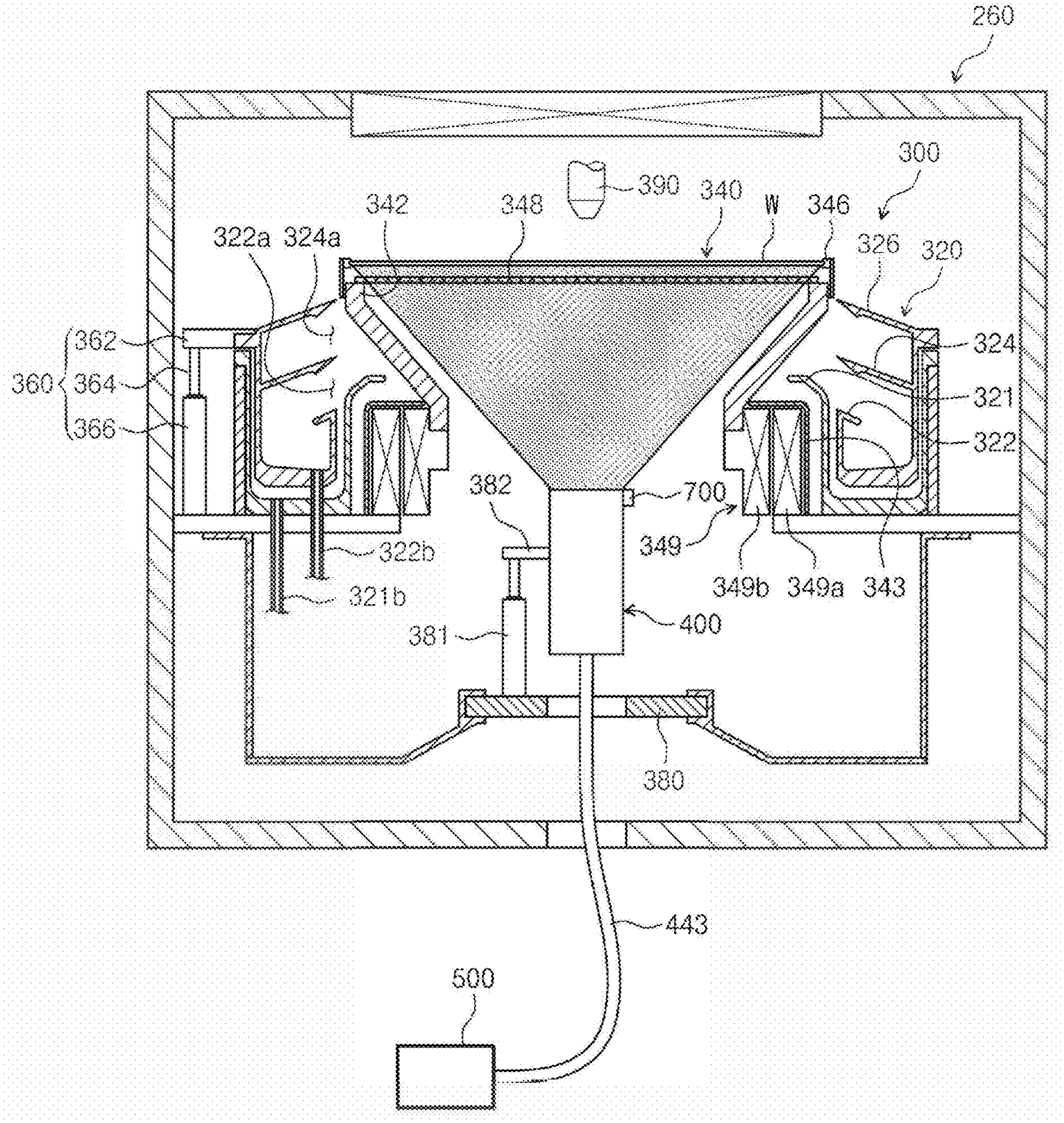
FIG. 3 is a cross-sectional view illustrating a substrate treating apparatus 300 according to a first embodiment provided in a process chamber 260 of FIG. 2.

FIG. 3 is a sectional view illustrating the substrate treating apparatus 300 provided in the process chamber 260 of FIG. 2 according to an embodiment. Referring to FIG. 3, the substrate treating apparatus 300 includes a treating vessel 320, a substrate support unit 340, a lifting/lowering unit 360, a liquid supply unit 390, and a laser irradiation unit 400, a photo-detector 700, and a processor (not shown).

The treating vessel 320 has a container shape that is open at the top. The treating vessel 320 includes a first recovery bowl 321 and a second recovery bowl 322. The recovery bowls 321 and 322 recover different treating liquids used for processes. The first recovery bowl 321 has an annular ring shape that surrounds the substrate support unit 340. The second recovery bowl 322 has an annular ring shape that surrounds the substrate support unit 340. In an embodiment, the first recovery bowl 321 has an annular ring shape that surrounds the second recovery bowl 322. The second recovery bowl 322 may be inserted into the first recovery bowl 321. The height of the second recovery bowl 322 may be greater than the height of the first recovery bowl 321. The second recovery bowl 322 may include a first guide part 326 and a second guide part 324. The first guide part 326 may be provided at the top of the second recovery bowl 322. The first guide part 326 may extend toward the substrate support unit 340. The first guide part 326 may be formed to be upwardly inclined toward the substrate support unit 340. In the second recovery bowl 322, the second guide part 324 may be spaced apart downward from the first guide part 326. The second guide part 324 may extend toward the substrate support unit 340. The second guide part 324 may be formed to be upwardly inclined toward the substrate support unit 340. A first inlet 324*a* through which a treating liquid is introduced is formed between the first guide part 326 and the second guide part 324. A second inlet 322*a* is provided under the second guide part 324. The first inlet 324*a* and the second inlet 322*a* may be located at different heights. The second guide part 324 may have a hole (not shown) formed therein, and the treating liquid introduced through the first inlet 324*a* may flow, through the hole (not shown), to a second recovery line 322*b* connected to the bottom of the second recovery bowl 322. The hole (not shown) of the second guide part 324 may be formed in the lowest position of the second guide part 324. A treating liquid recovered by the first recovery bowl 321 flows to a first recovery line 321*b* connected to the bottom of the first recovery bowl 321. The treating liquids introduced into the recovery bowls 321 and 322 may be supplied to an external treating liquid regeneration system (not shown) through the recovery lines 321*b* and 322*b* and may be regenerated by the regeneration system.

The lifting/lowering unit 360 rectilinearly moves the treating vessel 320 in an up/down direction. For example, the lifting/lowering unit 360 may be coupled to the second recovery bowl 322 of the treating vessel 320 and may move the second recovery bowl 322 in the up/down direction to change the height of the treating vessel 320 relative to the substrate support unit 340. The lifting/lowering unit 360 includes a bracket 362, a movable shaft 364, and an actuator 366. The bracket 362 is fixedly attached to an outer wall of the treating vessel 320, and the movable shaft 364 is fixedly coupled to the bracket 362 and is moved in the up/down direction by the actuator 366. The second recovery bowl 322 of the treating vessel 320 is moved downward such that, when a substrate W is loaded onto or unloaded from the substrate support unit 340, a top portion of the substrate support unit 340 protrudes above the treating vessel 320. Specifically, the second recovery bowl 322 of the treating vessel 320 is moved downward such that the top portion of the substrate support unit 340 further protrudes beyond the first guide part 326. Furthermore, when a process is performed, the height of the treating vessel 320 is adjusted depending on the types of treating liquids dispensed onto the substrate W, such that the treating liquids are introduced into the preset recovery bowls 321 and 322. Alternatively, the lifting/lowering unit 360 may move the substrate support unit 340 instead of the treating vessel 320 in the up/down direction. In another case, the lifting/lowering unit 360 may raise or lower the entire treating vessel 320 in the up/down direction. The lifting/lowering unit 360 is provided to adjust the relative height between the treating vessel 320 and the substrate support unit 340. Embodiments of the treating vessel 320 and the lifting/lowering unit 360 may be provided in various structures and methods depending on designs as long as the relative height between the treating vessel 320 and the substrate support unit 340 is able to be adjusted.

The substrate support unit 340 horizontally supports and rotates the substrate W during a process.

The substrate support unit 340 includes a window member 348, a spin housing 342, chuck pins 346, and a drive member 349.

The window member 348 is located under the substrate W. The window member 348 may have a shape substantially corresponding to the substrate W. For example, when the substrate W is a circular wafer, the window member 348 may have a substantially circular shape. The window member 348 may have the same diameter as the substrate W, or may have a smaller or larger diameter than the substrate W. The window member 348 may allow a laser to transmit through the window member 348 and reach the substrate W. The window member 348 may protect components of the substrate support unit 340 from a chemical and may be provided in various sizes and shapes depending on designs. The window member 348 may have a larger diameter than the substrate W.

The window member 348 may be formed of a material having high light transmittance. Accordingly, a laser emitted from a laser irradiation unit 400 may transmit through the window member 348. The window member 348 may be formed of a material having excellent corrosion resistance so as not to react with a chemical. For example, the window member 348 may be formed of quartz, glass, sapphire, or the like.

The spin housing 342 may be provided on a bottom surface of the window member 348. The spin housing 342 supports an edge of the window member 348. The spin housing 342 has an empty space extending therethrough in the up/down direction. The empty space formed by the spin housing 342 may have a gradually increasing inner diameter toward the window member 348 from a portion adjacent to the laser irradiation unit 400. The spin housing 342 may have a cylindrical shape, the inner diameter of which is gradually increased from a lower end to a top end. The empty space in the spin housing 342 may allow a laser emitted from the laser irradiation unit 400 통일, which will be described below, to be applied to the substrate W without interference with the spin housing 342. A connecting portion between the spin housing 342 and the window member 348 may have an air-tight structure such that a chemical dispensed onto the substrate W does not flow toward the laser irradiation unit 400.

The drive member 349 may be coupled with the spin housing 342 and may rotate the spin housing 342. Any member capable of rotating the spin housing 342 may be used as the drive member 349. For example, the drive member 349 may be a hollow motor. According to an embodiment, the drive member 349 includes a stator 349*a* and a rotor 349*b*. The stator 349*a* is fixed in one position, and the rotor 349*b* is coupled with the spin housing 342. In the illustrated embodiment, a hollow motor having the rotor 349*b* disposed inside and the stator 349*a* disposed outside is illustrated. A lower portion of the spin housing 342 may be coupled with the rotor 349*b* and may be rotated by rotation of the rotor 349*b*. In a case where a hollow motor is used as the drive member 349, a hollow motor having a small hollow space may be selected to correspond to the narrow lower portion of the spin housing 342. Accordingly, manufacturing cost may be reduced. According to an embodiment, the stator 349*a* of the drive member 349 may be fixedly coupled to a support wall on which the treating vessel 320 is supported. According to an embodiment, the substrate support unit 340 may further include a cover member 343 that protects the drive member 349 from a chemical.

The liquid supply unit 390 may be a component for dispensing a chemical onto the substrate W from above the substrate W and may include at least one chemical dispensing nozzle. The liquid supply unit 390 may pump the chemical out of a storage tank (not shown), may deliver the chemical, and may dispense the chemical onto the substrate W through the chemical dispensing nozzle. The liquid supply unit 390 may include an actuator and may be movable between a process position directly above the center of the substrate W and a standby position outside the substrate W by the actuator.

The liquid supply unit 390 may dispense various chemicals onto the substrate W depending on substrate treating processes. In a process of etching a silicon nitride film, the liquid supply unit 390 may dispense a chemical containing phosphoric acid ($H_3PO_4$) onto the substrate W. The liquid supply unit 390 may further include a deionized water (DIW) dispensing nozzle for rinsing a substrate surface after an etching process, and an isopropyl alcohol (IPA) dispensing nozzle and a nitrogen ($N_2$) dispensing nozzle for performing a drying process after the rinsing process. Although not shown, the liquid supply unit 390 may include a nozzle moving member (not shown) that supports and moves the chemical dispensing nozzle. The nozzle moving member (not shown) may include a support shaft (not shown), an arm (not shown), and an actuator (not shown). The support shaft (not shown) is located on one side of the treating vessel 320. The support shaft (not shown) has a rod shape, the lengthwise direction of which is parallel to the third direction 16. The support shaft (not shown) is rotatable by the actuator (not shown). The arm (not shown) is coupled to a top end of the support shaft (not shown). The arm (not shown) may extend from the support shaft (not shown) at a right angle thereto. The chemical dispensing nozzle is fixedly coupled to an end of the arm (not shown). As the support shaft (not shown) is rotated, the chemical dispensing nozzle is able to swing together with the arm (not shown). The chemical dispensing nozzle may be moved between the process position and the standby position. Selectively, the support shaft (not shown) may be movable upward and downward. Furthermore, the arm (not shown) is movable forward and backward along the lengthwise direction thereof.

The laser irradiation unit 400 is a component for applying a laser to the substrate W. The laser irradiation unit 400 may be located under the window member 348 in the substrate support unit 340. The laser irradiation unit 400 may emit a laser toward the substrate W located on the substrate support unit 340. The laser emitted from the laser irradiation unit 400 may be applied to the substrate W through the window member 348 of the substrate support unit 340. Accordingly, the substrate W may be heated to a set temperature.

The laser irradiation unit 400 may be configured to uniformly apply a laser to the entire surface of the substrate W. No special limitation applies to the laser irradiation unit 400, as long as the laser irradiation unit 400 is capable of uniformly applying a laser to the entire surface of the substrate W. Hereinafter, a laser irradiation unit 400-1 according to a first embodiment will be described with reference to FIG. 5, and a laser irradiation unit 400-2 according to a second embodiment will be described with reference to FIG. 6.

A laser generator 500 may generate a laser. The laser generator 500 may generate a laser having a wavelength that the substrate W may easily absorb. According to an embodiment, the laser generator 500 may be provided as an output apparatus capable of a high output of 4 kW to 5 kW.

Figure 4:
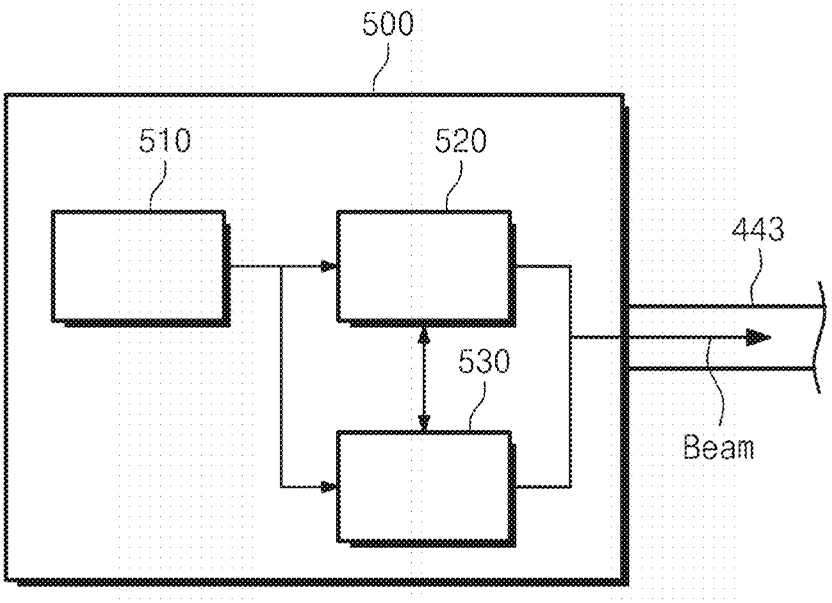
FIG. 4 is a schematic view of a laser generator 500 that provides a laser to the process chamber 260 of FIG. 2.

FIG. 4 is a schematic view of a laser generator 500 that provides a laser to the process chamber 260 of FIG. 2. Referring to FIG. 4, the laser generator 500 may include a laser source unit 510, a beam shaper 520, and a beam expander 530. The laser source unit 510 outputs the laser from an energy obtained from a power. The beam shaper 520 converts a profile of a laser output from the laser source unit 510. In an embodiment, the beam shaper 520 shapes an input laser to a set beam shape. In an embodiment, a laser in a form of a Gaussian beam may be input to the beam shaper 520 and converted into a parallel flat top beam or a trunked Gaussian beam. The beam expander 530 serves to enlarge a laser in the form of a parallel light having a predetermined diameter. For example, the beam expander 530 may include a plurality of lenses to change a diameter of the laser. The beam generated by the laser source unit 510 may be output through the beam shaper 520 and/or the beam expander 530. For example, the beam generated by the laser source unit 510 may pass through the beam shaper 520 and the beam expander 530, pass only the beam shaper 520, or pass only the beam expander 530. In addition, according to an embodiment, when an annular beam irradiation unit receives an annular laser generated from the laser generator 500, the annular beam irradiation unit 700 does not need to shape the laser in an annular shape.

Figure 5:
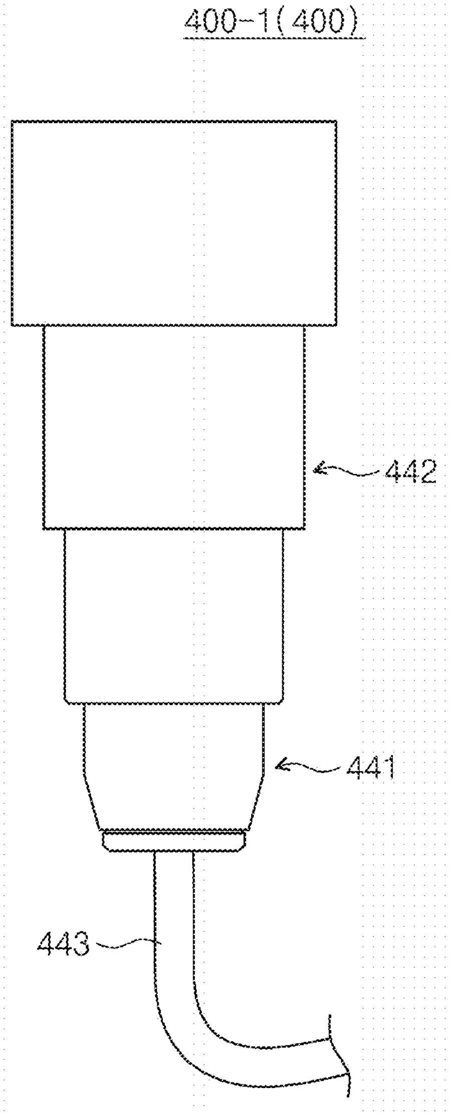
FIG. 5 is a side view of a laser irradiation unit 400-1 according to a first embodiment.

The laser irradiation unit 400-1 according to the first embodiment will be described below with reference to FIG. 5. FIG. 5 is a side view of the laser irradiation unit 400-1 according to the first embodiment. The laser irradiation unit 400-1 may include a lens module 442. The laser irradiation unit 400-1 may receive a laser from a laser delivery member 443. The lens module 442 may include a combination of at least one lens and a container for supporting and protecting a lens.

The laser delivery member 443 is a component that delivers a laser generated from a laser generator 500 to the lens module 442. The laser delivery member 443 may be, for example, an optical fiber. An end portion of the laser delivery member 443 may be coupled to a fastening member 441, and the first laser delivery member 443 may be coupled with the lens module 442 through the fastening member 441.

Figure 6:
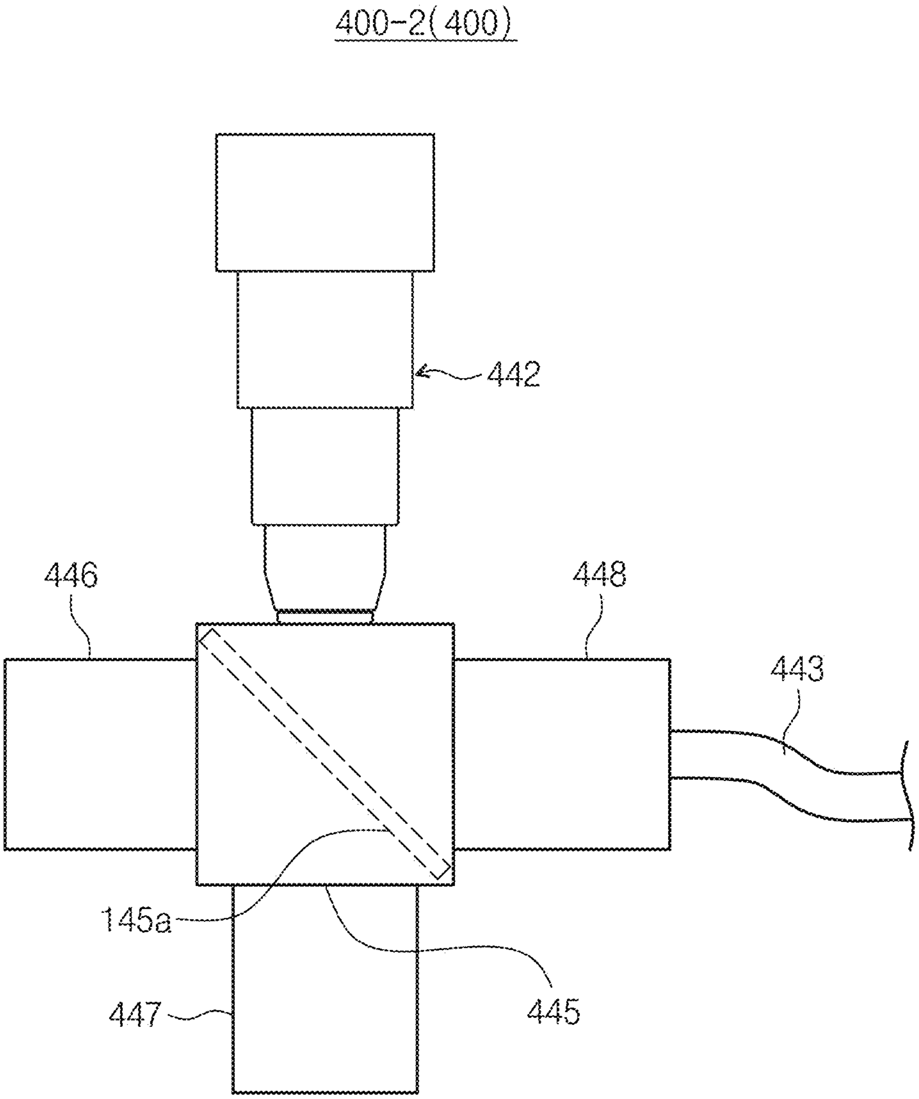
FIG. 6 is a side view of the laser irradiation unit 400-2 according to a second embodiment.
Figure 8:
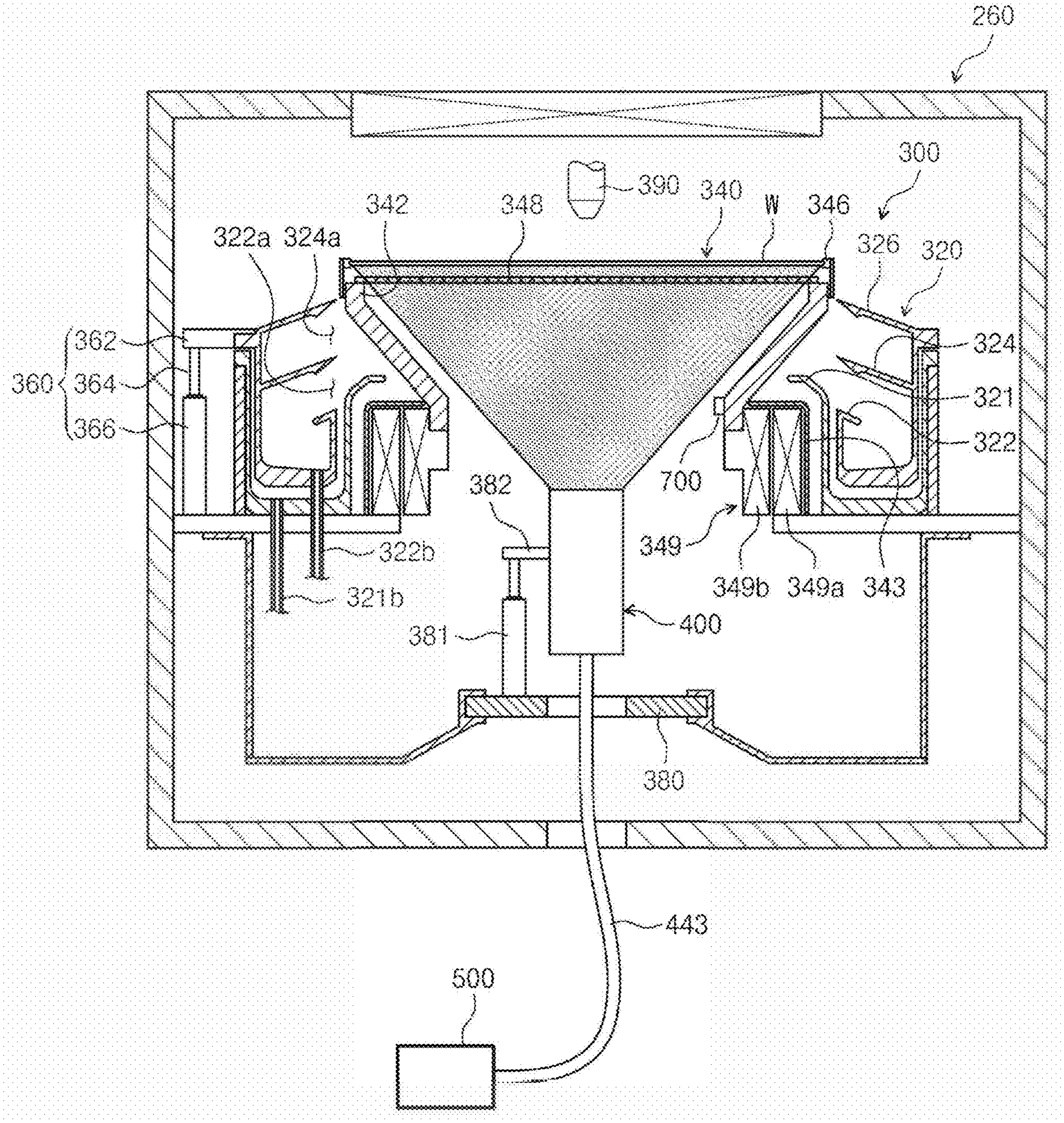
FIG. 8 is a cross-sectional view illustrating the substrate treating apparatus 1300 according to a second embodiment provided in the process chamber 260 of FIG. 2.

FIG. 6 is a view of the laser irradiation unit 400-2 according to the second embodiment. Referring to FIG. 8, the laser irradiation unit 400-2 may include a reflecting unit 445, an imaging unit 446, a sensing unit 447, and a collimator 448. The reflecting unit 445 may reflect, toward a lens module 442, part of a laser generated from the laser generator 500 and delivered through a laser delivery member 443 and may allow the rest to pass through. To this end, the reflecting unit 445 may include a reflecting mirror 145*a* installed at an angle of 45 degrees.

The imaging unit 446 may be coupled to the reflecting unit 445. The imaging unit 446 may photograph the laser passing through the reflecting unit 445 and may convert the laser into image data. The imaging unit 446 may analyze the image data to examine whether the laser is output from the laser generator 500 as designed and whether the laser is delivered through the laser delivery member 443 as designed.

The sensing unit 447 may be coupled to the reflecting unit 445 and may sense the intensity of the laser input to the reflecting unit 445. The sensing unit 447 may be, for example, a photo detector. When the intensity of the laser is excessively high, the substrate W may be rapidly heated. In contrast, when the intensity of the laser is excessively low, it may take long time to heat the substrate W. The sensing unit 447 may determine whether the intensity of the laser is an appropriate value.

Referring again to FIG. 3, the laser irradiation unit 400 may be coupled to an XYZ stage 380. The XYZ stage 380 may include a lifting actuator 381 and a coupling part 382 connected with the lifting actuator 461 and coupled with the laser irradiation unit 400. A position of the laser irradiation unit 400 relative to the substrate W may be adjusted by the XYZ stage 380. Furthermore, a laser intensity may be adjusted by adjusting a distance between the laser irradiation unit 400 and the substrate W through the lifting actuator 381.

The photo detector 700 may measure a light energy. In an embodiment, the photo detector measures an energy of a reflected light on a rear surface of a wafer after the wafer is loaded and before a process is started. In an embodiment, the photo-detector 700 may be provided by being attached to the container 442 of the laser irradiation unit 400. In an embodiment, the photo detector 700 may be provided at a different location as long as it is a location capable of measuring the reflected light. A method of calculating an output of a laser to heat the wafer W from the reflection energy measured using the photo detector 700 and a method of treating the substrate using the same will be described later.

Figure 7:
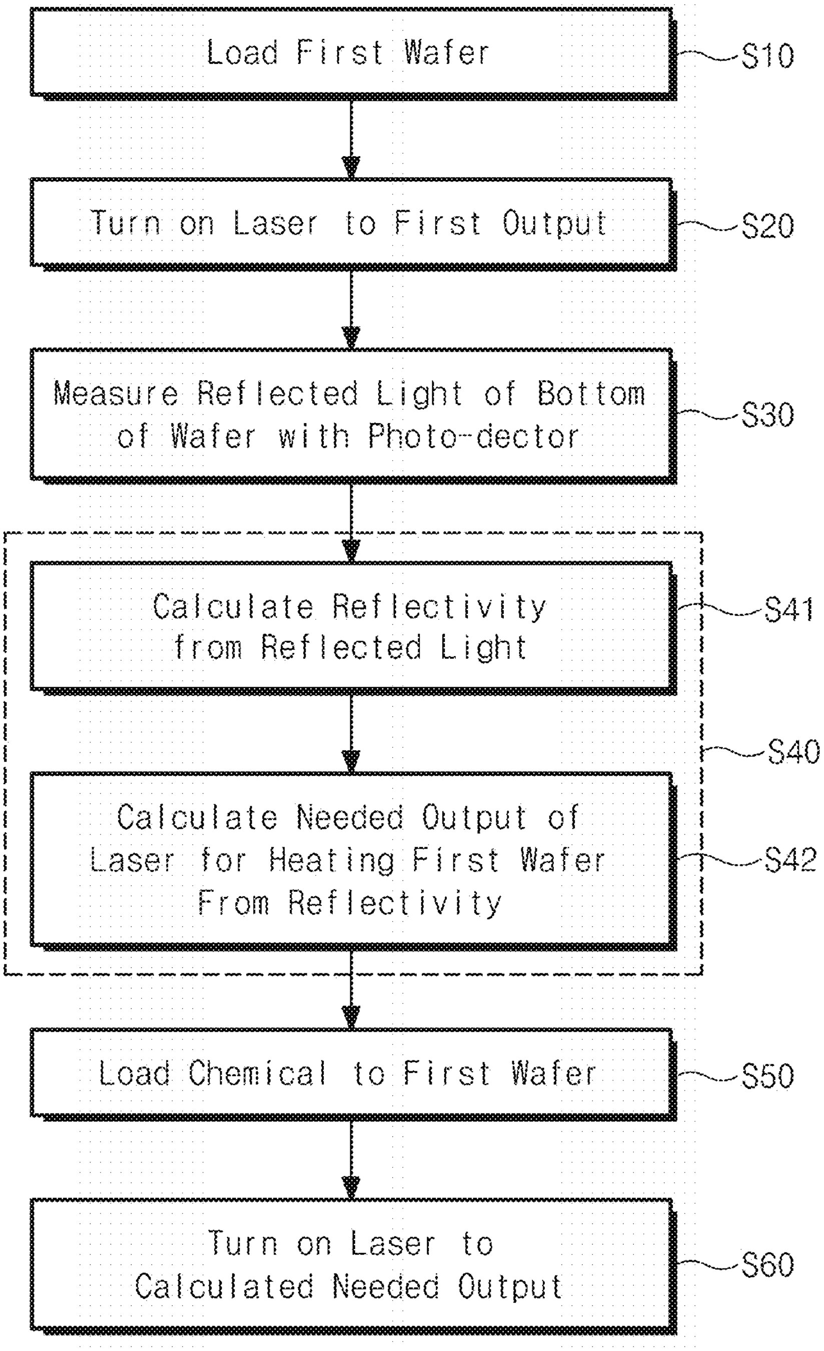
FIG. 7 is a flowchart of a substrate treating method according to an embodiment of the inventive concept.

FIG. 7 is a flowchart of a substrate treating method according to an embodiment of the inventive concept. The substrate treating method according to an embodiment of the inventive concept will be described with reference to FIG. 7.

A first wafer is loaded on a substrate support unit 340 S10. The first wafer is an embodiment of the substrate W. Terms such as a first wafer and a second wafer are terms used to distinguish the wafers.

In a state in which the first wafer is loaded, a laser of a first output is irradiated to a bottom surface of the first wafer (S20). The first output is lower than the second output for heating the wafer. For example, the first output may be 1000 W or less. For description, the laser of the first output is referred to as a first laser. The photo detector 700 measures a reflected light reflected from the first wafer by the first laser. For description, the reflected light reflected by the first laser is referred to as the first reflected light. The processor (not shown) collects an energy value of a reflected light detected by the photo detector 700. The processor (not shown) calculates the reflectivity B from the reflected light energy A (S41). The reflectivity may be calculated from a pre-stored reference value.

The pre-stored reference value is a value measured using a reference wafer. The reference value is a value quantified by the following method. First, the reference wafer is prepared. The prepared reference wafer is irradiated with a laser having an output Pref–out, and an energy of a reflected light is measured. The measured energy of the reflected light is defined as Aref, and a reflectivity is defined as Bref. Using the definition of reflectivity, an energy absorption rate of the reference wafer is defined as 100–Bref. PAB, which is an amount of an energy absorbed by the reference wafer, becomes Pref–out*Cref. Pref–out is provided as a value set so that PAB has a value at which the reference wafer is heated to a set temperature.

A reflectivity B of the first wafer may be defined in the equation of $B_{ref}*(A/A_{ref})$. Also, a laser energy absorption rate C of the first wafer is defined as 100–B. Since the energy absorption amounts of the first wafer and the reference wafer should be the same to heat them to similar conditions while excluding an influence by a laser reflection, P.sub.AB1, which is the amount of energy absorbed by the first wafer, is $P_{AB}$. According to an embodiment of the inventive concept, $P_{AB1}$ varies the $P_{out}$ value, which is an output of the laser, under the condition that the $P_{AB}$ value is the same. The amount of the $P_{out}$ is inversely proportional to a value C. $P_{out}$ is calculated by dividing $P_{AB}$ by a measured absorption rate C (S42).

TABLE 1

Equation for calculating the laser output of the first wafer

| | Reference Wafer | First Wafer |
|---|---|---|
| Measurement value of energy of reflected light (W) | $A_{ref}$ | A |
| Reflectivity (%) | $B_{ref}$ | $B = B_{ref}* (A/A_{ref})$ |
| Energy absorption rate (%) | $C_{ref} = 100 - B_{ref}$ | $C = 100 - B$ |
| Laser Output (W) | $P_{ref\text{-}out}$ | $P_{OUT} = P_{AB}/C$ |
| Absorbed energy (W) | $P_{AB} = P_{ref\text{-}out}*C_{ref}$ | $P_{AB1} = P_{OUT}*C$ |
| | | $P_{AB} = P_{AB1}$ |

The processor (not shown) controls the liquid supply unit 390 to apply a chemical to the first wafer and form a liquid film on a top surface of the first wafer. The processor (not shown) heats the first wafer and the liquid film by irradiating a second laser using $P_{out}$ as an output value to the first wafer on which the liquid film is formed.

According to the described embodiment, when the first laser is irradiated, when the energy of the reflected light of the first wafer is larger than the pre-stored reference value, the processor (not shown) sets the output $P_{out}$ of the second laser heating the first wafer to be larger than the reference output $P_{ref}$. When the energy of the reflected light of the first wafer is smaller than the pre-stored reference value, the processor (not shown) sets the output $P_{out}$ of the second laser heating the first wafer to be smaller than the reference output $P_{ref}$.

In an embodiment, the photo detector 700 detects the reflected light energy in real time while the first wafer is heated and treated by the second laser. The processor (not shown) monitors the reflected light energy detected in real time and adjusts the intensity of the second output when the reflected light energy changes. In an embodiment, when the energy of the reflected light decreases, the intensity of the second output decreases, and when the energy of the reflected light increases, the intensity of the second output is increased.

FIG. 8 is a cross-sectional view illustrating a substrate treating apparatus 1300 according to a second embodiment provided in the process chamber 260 of FIG. 2. In the description of FIG. 8, the same configuration as that of FIG. 3 will be replaced by the description of FIG. 3. In the second embodiment, the photo detector 700 may be provided by being attached to an inside of a spin housing 342.

Figure 9:
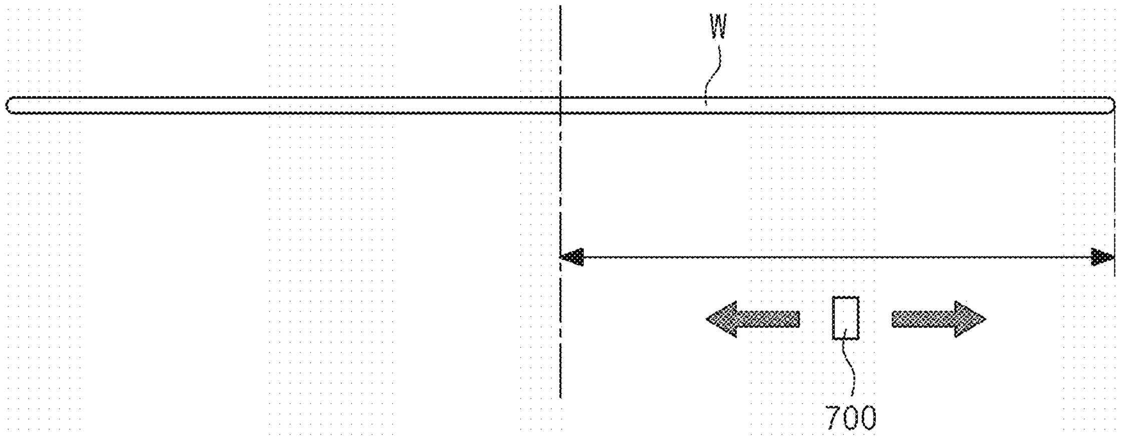
FIG. 9 is a cross-sectional view illustrating an operation of a photodetector 700 according to an embodiment of the inventive concept in the substrate treating apparatus.

FIG. 9 is a cross-sectional view illustrating an operation of a photodetector 700 according to an embodiment of the inventive concept in the substrate treating apparatus. The photo detector 700 may be combined with a configuration such as a stage capable of moving the photo detector 700 to scan a reflected light. According to an embodiment, the photodetector 700 may be provided to be translated from a center of a substrate W to an outer circumferential direction or from the outer circumferential direction to the center of the substrate. As the photo detector 700 moves, a reflected light for each position of the substrate W may be measured. The processor (not shown) may set a laser output based on the reflected light for each position.

Figure 10:
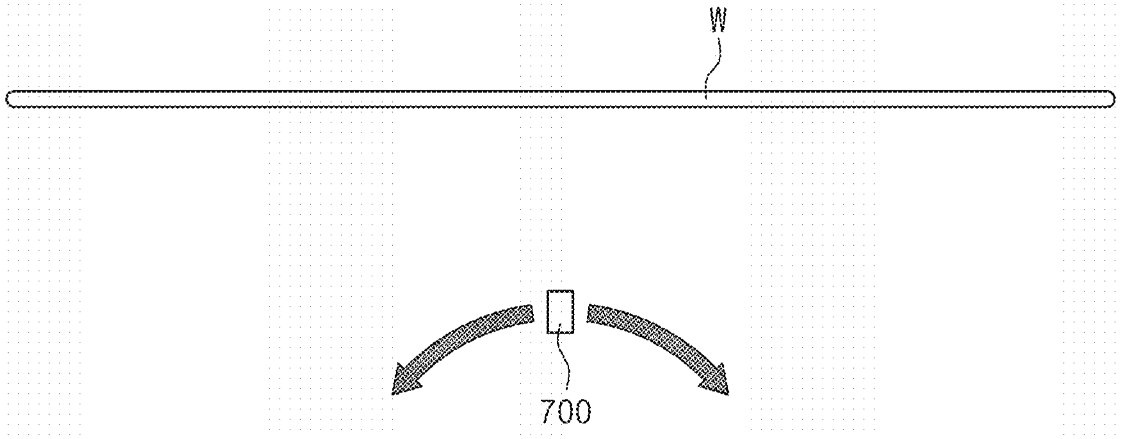
FIG. 10 is a cross-sectional view illustrating an operation of the photodetector 700 according to another embodiment of the inventive concept in the substrate treating apparatus.

FIG. 10 is a cross-sectional view illustrating an operation of a photodetector 700 according to another embodiment of the inventive concept in the substrate treating apparatus. The photo detector 700 may be provided to be rotatable, and to scan a reflected light. According to an embodiment, the photo detector 700 may measure a reflected light for each position of the substrate W while rotating from a first angle to a second angle. The processor (not shown) may set a laser output based on the reflected light for each position.

According to various embodiments of the inventive concept, in heating different wafers, even though conditions such as a lower film type or a thickness are different, the wafers may be heated to a desired temperature without having to be separately tested. In addition, since it may be heated to the desired temperature, an etching performance may be improved.

The processor which is not shown above may control an overall operation of the substrate treating apparatus. The processor (not shown) may include a central processing unit (CPU), a read only memory (ROM), and a random access memory (RAM). The CPU executes a desired processing such as an etching treatment according to various recipes stored in the storage area thereof.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a support configured to horizontally maintain a substrate;

a laser irradiation unit configured to irradiate the substrate with a laser;

a photo-detector configured to detect an energy of a reflective light reflected from the substrate among a laser irradiated on the substrate; and a processor, the processor being configured to cause the laser irradiation unit to first irradiate a bottom surface of the substrate using a first laser with a first output, and second irradiate the substrate to heat the substrate using a second laser with a second output, based on an energy of a first reflective light reflected from the bottom surface of the substrate by the first laser detected from the photo-detector, wherein the processor is configured to calculate a reflectivity and an absorption rate from the energy of the first reflective light, and set the second output to be inversely proportioned to the absorption rate.

2. The substrate treating apparatus of claim 1, wherein the first output is lower than the second output.

3. The substrate treating apparatus of claim 1, further comprising:

a liquid supply configured to supply a liquid on the substrate, and wherein the processor is configured to cause the laser irradiation unit to form a liquid film on the substrate, and irradiate the second laser of the second output to the substrate.

4. The substrate treating apparatus of claim 1, wherein the processor is configured to compare the energy of the first reflective light with a reference value which is pre-stored, and sets the second output to be higher than a reference output of the reference value if the energy of the first reflected light is larger than an energy of a reflected light of the reference value, and sets the second output to be lower than the reference output of the reference value if the energy of the first reflected light is smaller than the energy of the reflected light of the reference value.

5. The substrate treating apparatus of claim 1, wherein the processor is configured to set the second output to be the same as an energy absorbed by a reference wafer according to a reference output of a pre-stored reference value.

6. The substrate treating apparatus of claim 1, wherein the photo-detector is configured to detect a reflective light in real time while the substate is heat treated with the second laser, and the processor is configured to monitor the reflective light being detected in real time, and adjust an intensity of the second output if an energy of the reflective light changes.

7. The substrate treating apparatus of claim 5, wherein the processor is configured to adjust the intensity of the second output to be weaker if the energy of the reflective light becomes smaller.

8. The substrate treating apparatus of claim 6, wherein the processor is configured to adjust the intensity of the second output to be stronger if the energy of the reflective light becomes larger.

* * * * *